United States Patent
Iwasaki

(10) Patent No.: US 10,651,708 B2
(45) Date of Patent: May 12, 2020

(54) MOTOR CONTROL DEVICE AND ELECTRIC POWER STEERING APPARATUS

(71) Applicant: NIDEC ELESYS CORPORATION, Kawasaki-shi, Kanagawa (JP)

(72) Inventor: Akihiro Iwasaki, Kawasaki (JP)

(73) Assignee: NIDEC ELESYS CORPORATION, Kanagawa (JP)

( * ) Notice: Subject to any disclaimer, the term of this patent is extended or adjusted under 35 U.S.C. 154(b) by 95 days.

(21) Appl. No.: 16/145,487

(22) Filed: Sep. 28, 2018

(65) Prior Publication Data

US 2019/0103788 A1   Apr. 4, 2019

(30) Foreign Application Priority Data

Sep. 29, 2017   (JP) .................................. 2017-189731

(51) Int. Cl.
*H02K 11/33*   (2016.01)
*H02K 11/27*   (2016.01)
(Continued)

(52) U.S. Cl.
CPC ........... *H02K 11/33* (2016.01); *B62D 5/0406* (2013.01); *B62D 5/0463* (2013.01); *H02K 9/22* (2013.01); *H02K 11/27* (2016.01); *H02K 11/40* (2016.01); *H05K 1/0203* (2013.01); *H05K 1/144* (2013.01); *H05K 5/0047* (2013.01); *H05K 5/0247* (2013.01); *H05K 5/03* (2013.01); *H05K 7/1432* (2013.01); *H05K 7/20854* (2013.01); *B62D 5/0421* (2013.01); *H02K 5/225* (2013.01); *H02K 15/12* (2013.01); *H02K 2211/03* (2013.01);
(Continued)

(58) Field of Classification Search
CPC ........ H02K 11/33; H02K 11/27; H02K 11/40; H02K 9/22; H02K 5/225; H02K 15/12; H02K 2211/03; B62D 5/0406; B62D 5/0463; B62D 5/0421; H05K 1/0203; H05K 1/144; H05K 5/0047; H05K 5/0247; H05K 5/03; H05K 7/1432; H05K 7/20854; H05K 2201/042; H05K 2201/066; H05K 2201/10015; H05K 2201/10166

See application file for complete search history.

(56) References Cited

U.S. PATENT DOCUMENTS

2010/0328901 A1* 12/2010 Minato ................. H01L 21/561
361/730
2011/0254388 A1* 10/2011 Yamasaki ............ B62D 5/0406
310/43

(Continued)

FOREIGN PATENT DOCUMENTS

JP   2016-144380 A   8/2016

*Primary Examiner* — Mohamad A Musleh
(74) *Attorney, Agent, or Firm* — Keating & Bennett

(57) ABSTRACT

A motor control device includes a resin cover, a control board on which at least a computer is mounted, a power board on which at least an inverter circuit and electrolytic capacitors are mounted, and a heat sink that radiates heat generated by the control board and heat generated by the power board, and controls a motor. The motor control device is electrically connected to the motor, and the resin cover, the control board, the power board, and the heat sink are disposed in order of the power board, the heat sink, the control board, and the resin cover in an axial direction of the motor from a motor side of the motor control device.

20 Claims, 8 Drawing Sheets

(51) Int. Cl.
  *H02K 11/40* (2016.01)
  *H05K 1/14* (2006.01)
  *H05K 1/02* (2006.01)
  *H05K 5/02* (2006.01)
  *H05K 5/03* (2006.01)
  *H05K 5/00* (2006.01)
  *H05K 7/20* (2006.01)
  *B62D 5/04* (2006.01)
  *H05K 7/14* (2006.01)
  *H02K 9/22* (2006.01)
  *H02K 5/22* (2006.01)
  *H02K 15/12* (2006.01)

(52) U.S. Cl.
  CPC . *H05K 2201/042* (2013.01); *H05K 2201/066* (2013.01); *H05K 2201/10015* (2013.01); *H05K 2201/10166* (2013.01)

(56) References Cited

U.S. PATENT DOCUMENTS

| | | | | |
|---|---|---|---|---|
| 2011/0285223 | A1* | 11/2011 | Miyachi | H02K 11/33 310/64 |
| 2012/0286603 | A1* | 11/2012 | Suga | H02K 5/04 310/71 |
| 2015/0156927 | A1* | 6/2015 | Tsuboi | H05K 7/20854 361/704 |
| 2015/0180316 | A1* | 6/2015 | Maeshima | B62D 5/0406 310/71 |
| 2018/0006521 | A1 | 1/2018 | Fujimoto | |

\* cited by examiner

MOTOR CONTROL DEVICE AND ELECTRIC POWER STEERING APPARATUS

CROSS REFERENCE TO RELATED APPLICATIONS

This application claims the benefit of priority to Japanese Patent Application No. 2017-189731 filed on Sep. 29, 2017. The entire contents of this application are hereby incorporated herein by reference.

BACKGROUND OF THE INVENTION

1. Field of the Invention

The present invention relates to a motor control device and an electric power steering apparatus.

2. Description of the Related Art

In recent years, there has been a mechatronic integration motor in which an electric motor and an electronic control device that controls the electric motor are integrated.

An electric power steering apparatus that assists the handle operation (steering) of a driver has hitherto been installed in a vehicle. The mechatronic integration motor has also been employed in the electric power steering apparatus. For example, a mechatronic integration motor in Japanese Patent Laid-Open No. 2016-144380 suppresses the upsizing of a housing in which the electronic control device is accommodated in the radial direction thereof and supplies electric power and control signals to circuit units by a connector terminal assembly having a simple configuration in which relay connectors are reduced.

A large number of various devices are installed in the vehicle, and hence each device is required to be downsized. The electric power steering apparatus is also downsized by employing the mechatronic integration motor. When the motor control device of the mechatronic integration motor is designed so as to prevent the upsizing of the motor in the radial direction thereof, the radial dimension of the motor control device can be suppressed but the axial dimension of the motor control device tends to be upsized. Meanwhile, when the motor control device of the mechatronic integration motor is designed so as to prevent the upsizing of the motor in the axial direction thereof, the axial dimension of the motor control device can be suppressed but the radial dimension of the motor control device tends to be upsized. That is, the downsizing of both the radial dimension and the axial dimension of the motor control device has not been easy and has been a problem.

SUMMARY OF THE INVENTION

According to preferred embodiments of the present invention, a motor control device includes a resin cover defined by integrally molding an external power supply connector to be connected to an electric power supply source, and a plurality of external signal connectors with a resin material; a control board on which at least a computing device is mounted; a power board on which at least an inverter circuit and a plurality of electrolytic capacitors are mounted; and a heat sink that radiates heat generated by the control board and heat generated by the power board, and controls a motor. The motor control device is electrically connected to the motor, and the resin cover, the control board, the power board, and the heat sink are disposed in an order of the power board, the heat sink, the control board, and the resin cover in an axial direction of the motor from a motor side of the motor control device. The plurality of electrolytic capacitors are mounted on a surface of the power board facing the motor, and the power board is covered by a housing of the motor.

According to a preferred embodiment of this application as above, the motor control device and an electric power steering apparatus that can downsize the entire assembly of the motor control device and the motor is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Examples of motor control devices and electric power steering apparatuses are described below with reference to the drawings.

Figure 1:
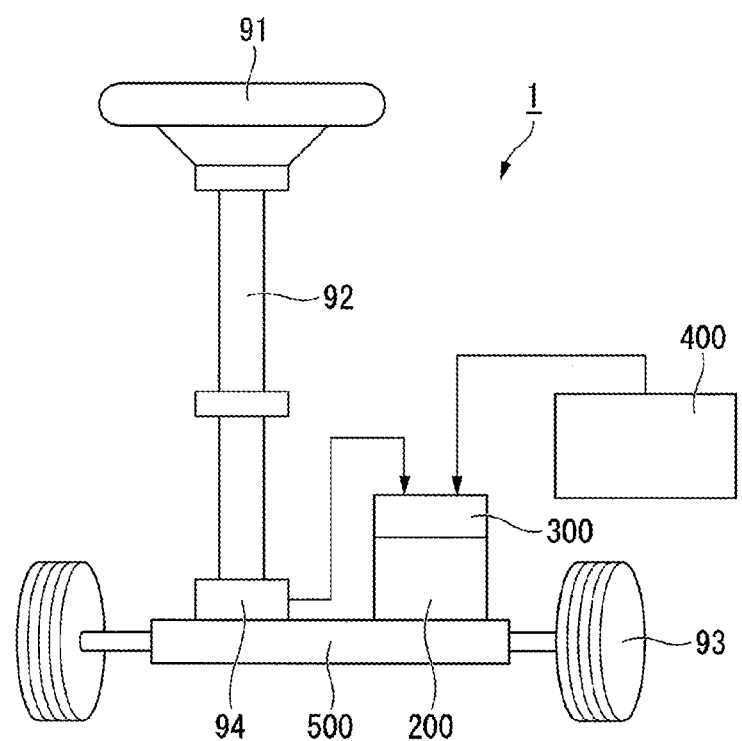
FIG. 1 is a schematic view of an electric power steering apparatus according to a preferred embodiment of the present invention.

FIG. 1 shows a schematic view of an electric power steering apparatus 1 according to a preferred embodiment of the present invention. The electric power steering apparatus 1 is an apparatus that assists the handle operation of a driver in transportation equipment such as an automobile. The electric power steering apparatus 1 of a preferred embodiment of the present invention preferably includes a torque sensor 94, a motor 200, and a motor control device 300.

The torque sensor 94 is mounted on a steering shaft 92. When the driver rotates the steering shaft 92 by operating a steering wheel (hereinafter also referred to as a "handle") 91, the torque sensor 94 detects a torque applied to the steering shaft 92. That is, the torque sensor 94 detects the torque caused by the handle operation. A torque signal that is a detection signal of the torque sensor 94 is output from the torque sensor 94 to the motor control device 300. The motor control device 300 drives the motor 200 on the basis of the torque signal input from the torque sensor 94. Note that the motor control device 300 may refer to other information (for example, vehicle speed) in addition to the torque signal.

The motor control device 300 supplies a driving current to the motor 200 with use of the electric power acquired from a power supply source 400. A driving force generated from the motor 200 is transmitted to wheels 93 via a gearbox 500. As a result, the steering angle of the wheels 93 changes. As described above, the electric power steering apparatus 1 changes the steering angle of the wheels 93 by amplifying the torque of the steering shaft 92 by the motor 200. As a result, the driver is able to operate a steering wheel 91 with a light force.

Figure 2:
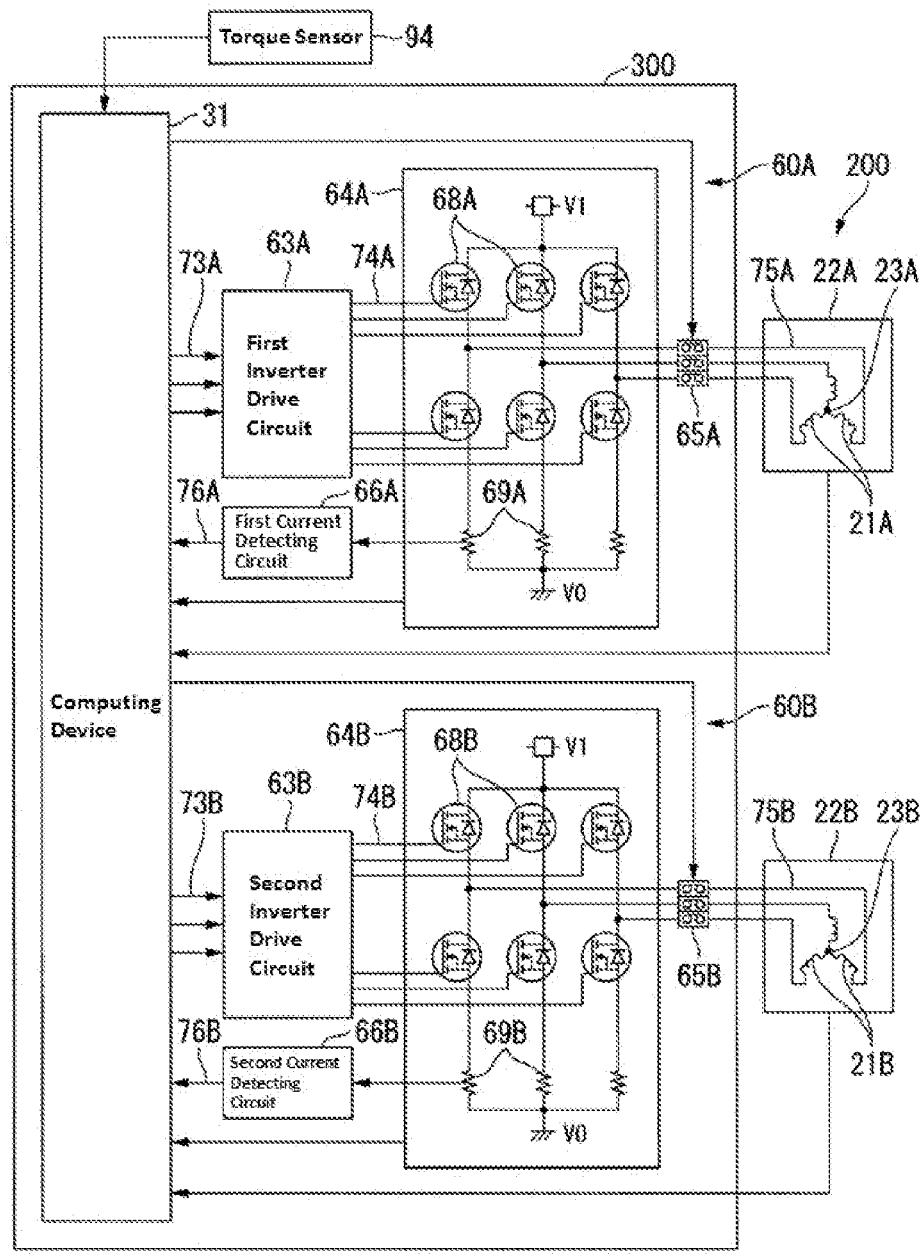
FIG. 2 is a block diagram showing a configuration of a motor control device according to a preferred embodiment of the present invention.

Next, a configuration of the motor control device 300 used in the electric power steering apparatus 1 is described. FIG. 2 is a block diagram showing the configuration of the motor control device 300. As shown in FIG. 2, the motor control device 300 includes an electric circuit including a computing device 31 such as a microcontroller. The motor control device 300 is electrically connected to the torque sensor 94, the motor 200, and the power supply source 400 (see FIG. 1).

In this preferred embodiment, a three-phase synchronous brushless motor preferably is used as the motor 200 of the electric power steering apparatus 1, for example. When the motor 200 is driven, U-phase, V-phase, and W-phase currents are supplied to a plurality of coils 21A and 21B in the motor 200 from the motor control device 300. Then, a rotating magnetic field is generated between a stator including the coils 21A and 21B and a rotor including a magnet. As a result, the rotor rotates with respect to the stator of the motor 200.

Further, as shown in FIG. 2, the motor 200 of this preferred embodiment preferably includes two sets of coil groups formed by U-phase, V-phase, and W-phase coils. The two sets of coil groups are hereinafter referred to as a first coil group 22A and a second coil group 22B. The three coils 21A of the first coil group 22A and the three coils 21B of the second coil group 22B are each connected to each other by a star connection. However, each of the first coil group 22A and the second coil group 22B may be connected by a delta connection.

The motor control device 300 individually supplies the driving current to the first coil group 22A and the second coil group 22B. That is, the motor control device 300 controls the motor 200 including the first coil group 22A and the second coil group 22B. The motor control device 300 preferably includes a first control system 60A that supplies the driving current to the first coil group 22A, and a second control system 60B that supplies the driving current to the second coil group 22B.

A first inverter drive circuit 63A is an electric circuit to operate a first inverter 64A. The first inverter drive circuit 63A supplies a PWM signal 74A that is a pulse wave to six first switching elements 68A of the first inverter 64A in accordance with a driving instruction 73A output from the computing device 31. The PWM signal 74A supplied to each of the first switching elements 68A includes a duty ratio designated by the driving instruction 73A.

The first inverter 64A is an electric power converter that generates a driving current 75A on the basis of the PWM signal 74A. As shown in FIG. 2, the first inverter 64A includes the six first switching elements 68A. A transistor such as an FET is used as the first switching element 68A, for example. In the example in FIG. 2, three sets of two first switching elements 68A connected in series are provided in parallel with each other between a power supply voltage V1 and a ground voltage V0.

Ends of the three coils 21A of the first coil group 22A are connected to each other at a neutral point 23A. Further, the other ends of the three coils 21A are connected to connections between the first switching elements 68A on the plus side and the first switching elements 68A on the negative side of the three sets of the first switching elements 68A of the first inverter 64A. When the six first switching elements 68A are turned on or off by the PWM signal 74A, the driving current 75A is supplied to each phase of the coils 21A of the first coil group 22A from the first inverter 64A according to the on or off state thereof.

Further, as shown in FIG. 2, the first inverter 64A preferably includes three first shunt resistors 69A. The three first shunt resistors 69A are interposed between the first switching elements 68A on the negative side of three sets of the first switching elements 68A and the ground voltage V0. When the driving current 75A is supplied to the first coil group 22A, the feedback currents in each phase from the first coil group 22A to the first inverter 64A respectively flow to the three first shunt resistors 69A.

A first motor current cut-off circuit 65A is provided in paths of the currents for the three phases between the first inverter 64A and the first coil group 22A. For example, a mechanical relay or an FET is used as the first motor current cut-off circuit 65A. The first motor current cut-off circuit 65A is able to switch the path of the current between an energized state and a cutoff state for each phase on the basis of a signal from the computing device 31.

A first current detecting circuit 66A is an electric circuit that measures the current flowing through the first shunt resistors 69A. By measuring a potential difference between both ends of the three first shunt resistors 69A, the first current detecting circuit 66A generates a detection signal 76A indicating a current (shunt current) flowing through each of the first shunt resistors 69A. The generated detection signal 76A is sent to the computing device 31 from the first current detecting circuit 66A.

The second control system 60B preferably has a configuration equivalent to that of the first control system 60A. That is, as shown in FIG. 2, the second control system 60B includes a second inverter drive circuit 63B, a second inverter 64B, a second motor current cut-off circuit 65B, and a second current detecting circuit 66B. The second control system 60B supplies a driving current 75B to the second coil group 22B by operating those units. Note that the detailed operation of the units in the second control system 60B are similar to that of the first control system 60A, and hence overlapping descriptions thereof are omitted. In FIG. 2, the signals exchanged among the units in the second control system 60B are denoted by characters 73B to 76B corresponding to the driving instruction 73A, the PWM signal 74A, the driving current 75A, and the detection signal 76A exchanged among the units in the first control system 60A.

Figure 3A:
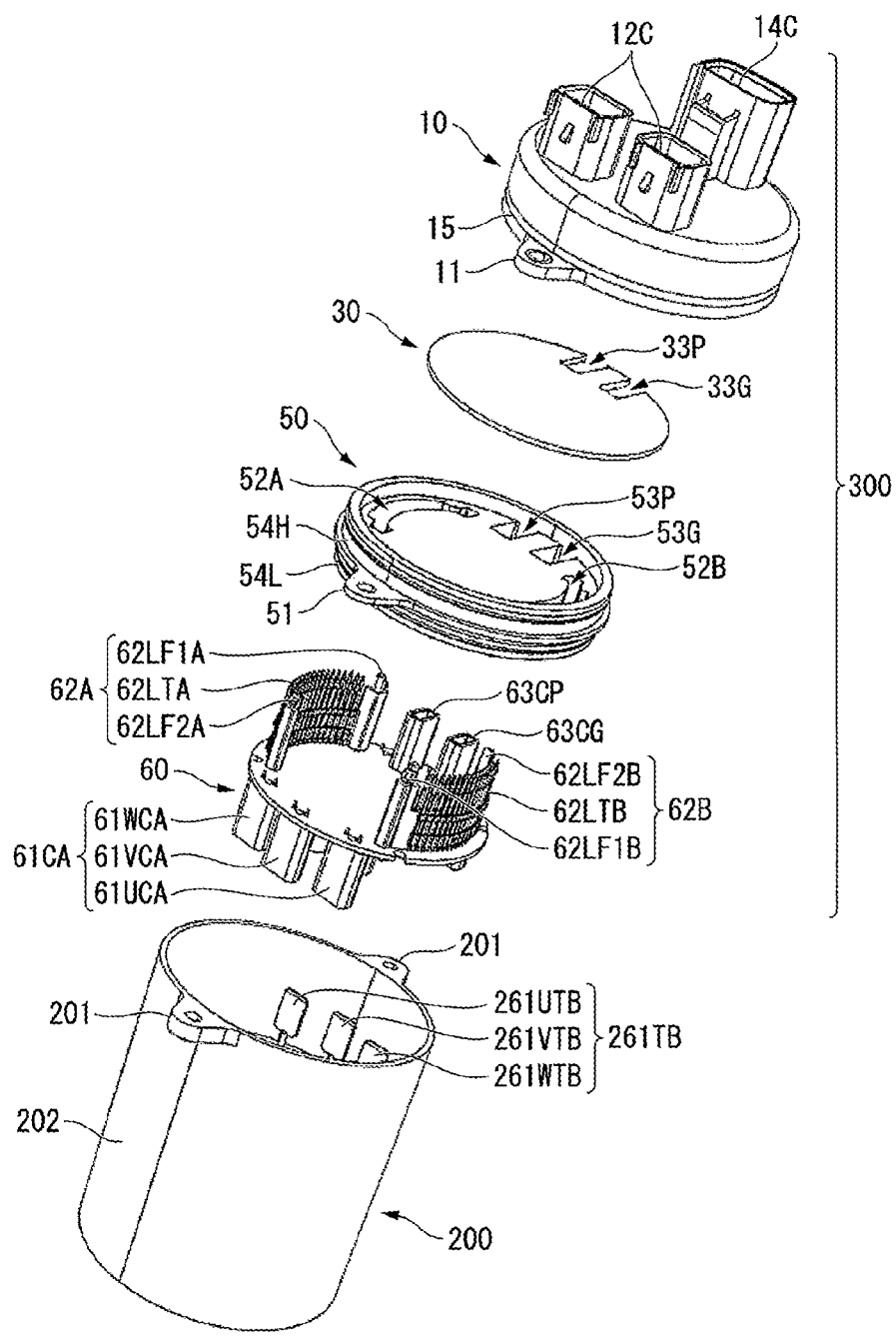
FIG. 3A is an exploded perspective view of the motor control device and a motor seen from an opposite side of the motor across the motor control device.
Figure 3B:
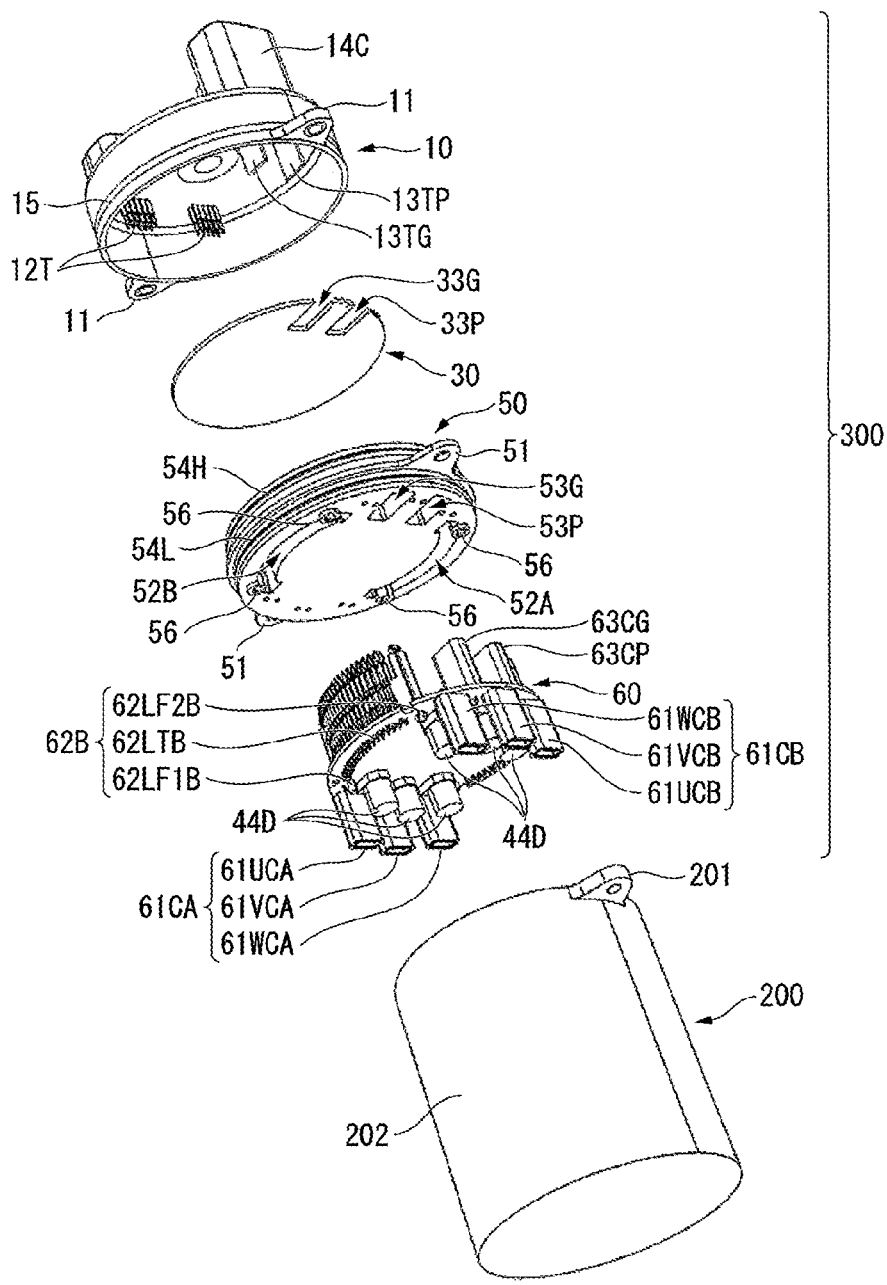
FIG. 3B is an exploded perspective view of the motor control device and the motor seen from an opposite side of the motor control device across the motor.

FIG. 3A is an exploded perspective view of the motor control device 300 and the motor 200 seen from an opposite side of the motor 200 across the motor control device 300. FIG. 3B is an exploded perspective view of the motor control device 300 and the motor 200 seen from an opposite side of the motor control device 300 across the motor 200. As shown in FIGS. 3A and 3B, the motor control device 300 preferably includes at least a resin cover 10, a control board 30, a heat sink 50, and a power board (circuit board) 60.

Figure 4A:
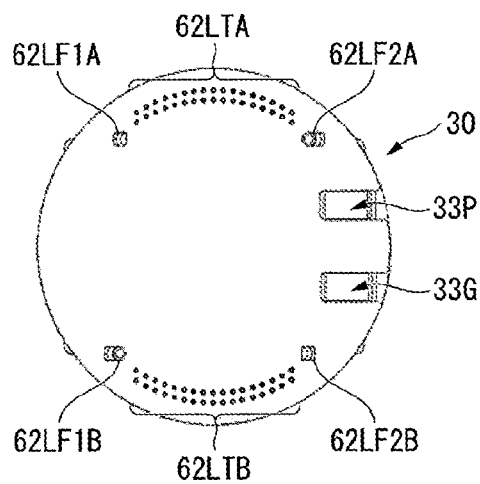
FIG. 4A is a view showing one surface of a control board according to a preferred embodiment of the present invention.
Figure 4B:
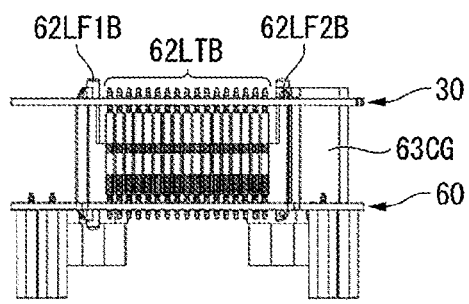
FIG. 4B is a view showing a relationship between the control board and a power board according to a preferred embodiment of the present invention.
Figure 4C:
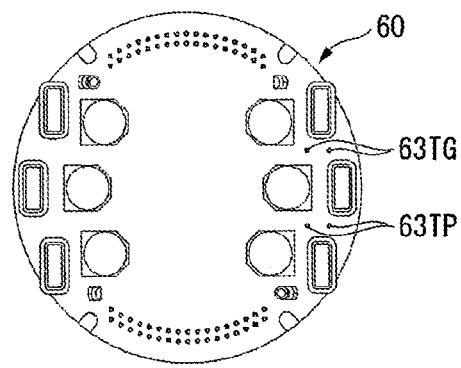
FIG. 4C is a view showing the other surface of the power board.

FIG. 4A is a view showing one surface (an upper surface in FIGS. 3A and 3B) of the control board 30. FIG. 4B is a view showing a relationship between the control board 30 and the power board 60. FIG. 4C is a view showing the other surface (a lower surface in FIGS. 3A and 3B) of the power board 60.

As shown in FIG. 3A, FIG. 3B, and FIG. 4C, the power board 60 is preferably a circular printed circuit mounting board. The diameter of the power board 60 is smaller than the diameter of the motor 200. In detail, the diameter of the power board 60 is smaller than the internal diameter of a housing 202 of the motor 200. By this configuration, the power board 60 is arranged in a dead space in the housing 202 of the motor 200 when the motor control device 300 is assembled to the motor 200 in the axial direction of the motor. As a result, the motor control device 300 does not bulge out in the radial direction of the motor 200, and a mechatronic integration motor (the assembly of the motor control device 300 and the motor 200) is able to be downsized.

The first switching element 68A (not shown in FIGS. 3A and 3B, see FIG. 2) of the first inverter 64A, the second switching element 68B (not shown in FIGS. 3A and 3B, see FIG. 2) of the second inverter 64B, a first signal connector 62A and a second signal connector 62B, a power supply terminal connector 63CP a Ground terminal connector 63CG, and the like are mounted on one surface (an upper surface in FIGS. 3A and 3B) of the power board 60. That is, the power board 60 includes the first inverter 64A, the second inverter 64B, the power supply terminal connector 63CP, the Ground terminal connector 63CG, and the like. The first switching element 68A and the second switching element 68B are preferably soldered on the power board 60 by reflow soldering.

The second signal connector 62B preferably includes a plurality of second signal terminals 62LTB, a second signal connector positioning portion 62LF1B, and a second signal connector positioning portion 62LF2B. The second signal terminals 62LTB electrically connect the power board 60 and the control board to each other. Lower end portions of the second signal connector positioning portions 62LF1B and 62LF2B are inserted into positioning holes in the power board 60 and are preferably connected to the power board 60 by snap-fit connection, for example. Lower end portions of the second signal terminals 62LTB are inserted into through-holes in the power board 60 and are preferably electrically connected to the power board 60 by press-fit connection, for example. The plurality of second signal terminals 62LTB are preferably disposed on the outer peripheral portion of the power board 60 in an arc-shaped manner.

Note that the lower end portions of the second signal terminals 62LTB may be inserted into the through-holes in the power board 60 and soldered on the other surface (the lower surface in FIGS. 3A and 3B) of the power board 60 if so desired.

Note that the first signal connector 62A is preferably similar to the second signal connector 62B, and hence overlapping descriptions thereof are omitted. In FIG. 3A, a character A corresponding to a character B for each unit in the second signal connector 62B is affixed to the characters for each unit in the first signal connector 62A.

The power supply terminal connector 63CP electrically connects the power board 60 and a power supply terminal 13TP of the resin cover 10.

Figure 5A:
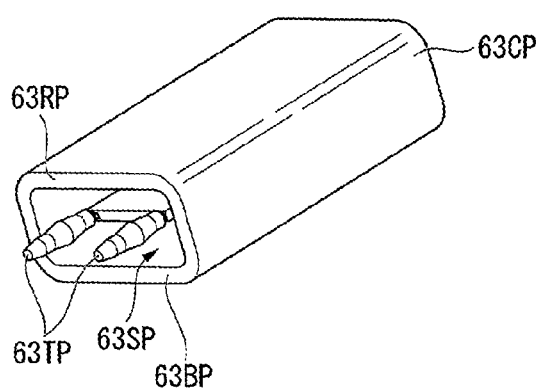
FIG. 5A is a perspective view of a power supply terminal connector according to a preferred embodiment of the present invention.
Figure 5B:
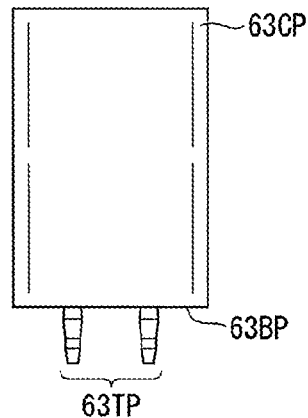
FIG. 5B is a front view of the power supply terminal connector.
Figure 5C:
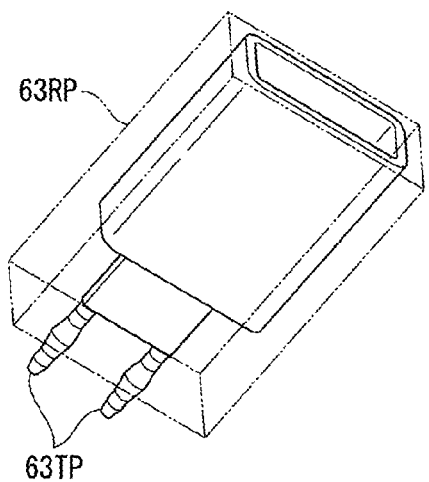
FIG. 5C is a perspective view of a power supply terminal connector terminal according to a preferred embodiment of the present invention.

FIG. 5A is a perspective view of the power supply terminal connector 63CP. FIG. 5B is a front view of the power supply terminal connector 63CP. FIG. 5C is a perspective view of a power supply terminal connector terminal 63TP.

As shown in FIGS. 5A to 5C, the power supply terminal connector 63CP preferably includes the power supply terminal connector terminal 63TP made from a metal material, and a cover portion 63RP made from an electrical insulating material (resin material). The power supply terminal connector terminal 63TP is preferably inserted into through-holes in the power board 60 and soldered on the other surface (the lower surface in FIGS. 3A and 3B) of the power board 60. Note that the power supply terminal connector terminal 63TP may be soldered on the power board 60 by reflow soldering.

The Ground terminal connector 63CG electrically connects the power board 60 and a Ground terminal 13TG of the resin cover 10 to each other.

Figure 6A:
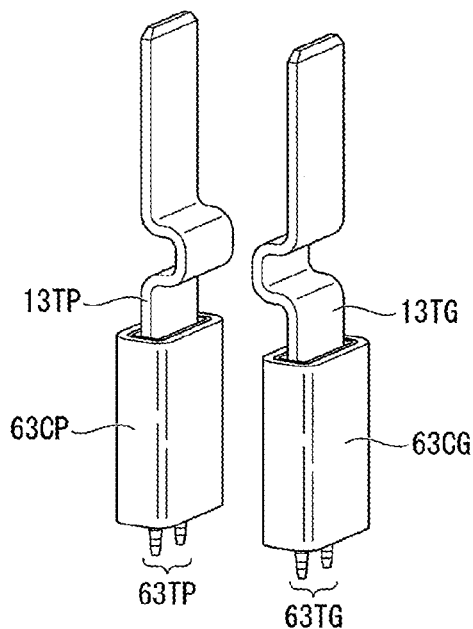
FIG. 6A is a perspective view of the power supply terminal connector, a Ground terminal connector, a power supply terminal, and a Ground terminal according to a preferred embodiment of the present invention.

FIG. 6A is a perspective view of the power supply terminal connector 63CP, the Ground terminal connector 63CG, the power supply terminal 13TP, and the Ground terminal 13TG.

As shown in FIG. 6A, the Ground terminal connector 63CG preferably includes a Ground terminal connector terminal 63TG configured in a similar manner as the power supply terminal connector terminal 63TP, and a cover portion structured in a similar manner as the cover portion 63RP (see FIGS. 5A and 5C). The Ground terminal connector terminal 63TG is inserted into through-holes in the power board 60 and soldered on the other surface (the lower surface in FIGS. 3A and 3B) of the power board 60. Note that the Ground terminal connector terminal 63TG may be soldered on the power board 60 by reflow soldering.

The power supply terminal connector 63CP and the Ground terminal connector 63CG preferably have the same shape.

As shown in FIGS. 5A to 5C, the power supply terminal connector 63CP is defined by integrally molding the power supply terminal connector terminal 63TP that is a metal member with a resin material. A lower surface 63BP (a lower surface in FIGS. 5A and 5B) of the cover portion 63RP of the power supply terminal connector 63CP faces an upper mounting surface (upper surface) of the power board 60. The cover portion 63RP is cylindrical or substantially cylindrical. There is an internal space 63SP (gap) between an inner circumferential surface of the cover portion 63RP and the power supply terminal connector terminal 63TP.

For example, when the power supply terminal connector terminal 63TP is soldered on the power board 60, there is a possibility that excess solder may remain on the upper surface of the power board 60. The excess solder is located on the periphery of the power supply terminal connector terminal 63TP. In an example shown in FIG. 5A, the internal space 63SP is arranged between a portion (that is, two leg-shaped portions) of the power supply terminal connector terminal 63TP that is connected to the power board 60, and the cover portion 63RP, and hence the excess solder is able to be accommodated in the internal space 63SP. As a result, in the example shown in FIG. 5A, a detrimental possibility that the excess solder will end up between the lower surface 63BP of the power supply terminal connector 63CP and the mounting surface of the power board 60 can be suppressed, and the lower surface 63BP of the power supply terminal connector 63CP and the mounting surface of the power board 60 can be brought into abutment. Therefore, the power supply terminal connector 63CP can be positioned and mounted on the power board 60 with high precision in the height direction.

Note that the Ground terminal connector 63CG is preferably similar to the power supply terminal connector 63CP, and hence overlapping descriptions thereof are omitted.

A plurality of electrolytic capacitors 44D that are components relatively higher than the first switching element 68A and the second switching element 68B are preferably mounted on the other surface (the lower surface in FIGS. 3A and 3B) of the power board 60. Further, three first motor terminal connectors 61CA to which the other ends of the three coils 21A of the first coil group 22A are electrically connected are mounted on the other surface of the power board 60. Further, three second motor terminal connectors 61CB to which the other ends of the three coils 21B of the second coil group 22B are electrically connected are mounted on the other surface of the power board 60. That is, the power board 60 includes the electrolytic capacitors 44D, the first motor terminal connectors 61CA, and the second motor terminal connectors 61CB. Components such as coils and relays may be mounted on the other surface of the power board 60.

The plurality of electrolytic capacitors 44D are soldered on the power board 60 by reflow soldering.

Figure 6B:
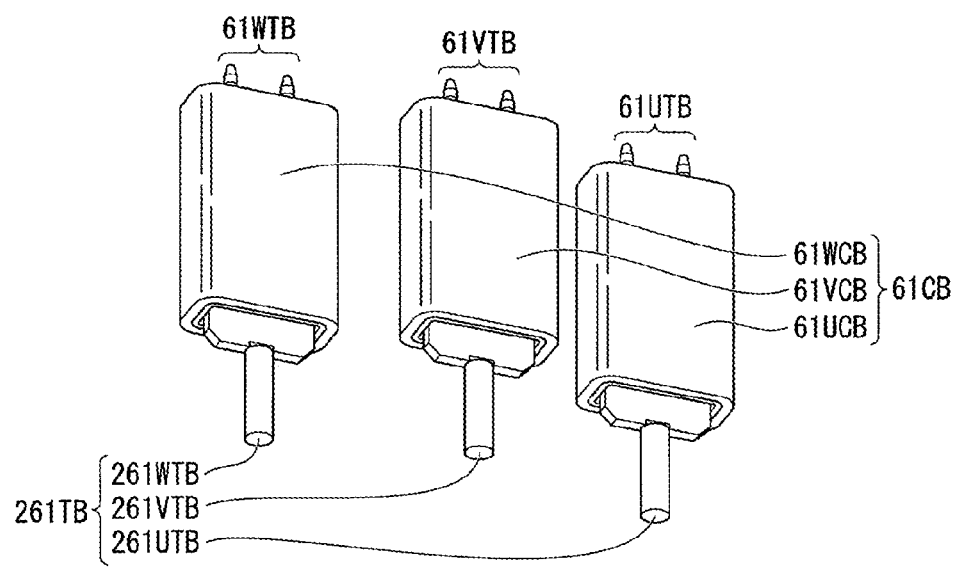
FIG. 6B is a perspective view of a second motor terminal connector according to a preferred embodiment of the present invention.

FIG. 6B is a perspective view of the second motor terminal connectors 61CB.

As shown in FIG. 6B, the second motor terminal connectors 61CB include a U-phase second motor terminal connector 61UCB, a V-phase second motor terminal connector 61VCB, and a W-phase second motor terminal connector 61WCB. The U-phase second motor terminal connector 61UCB includes a U-phase second motor terminal connector terminal 61UTB. The V-phase second motor terminal connector 61VCB includes a V-phase second motor terminal connector terminal 61VTB. The W-phase second motor terminal connector 61WCB includes a W-phase second motor terminal connector terminal 61WTB. The U-phase second motor terminal connector terminal 61UTB, the V-phase second motor terminal connector terminal 61VTB, and the W-phase second motor terminal connector terminal 61WTB are inserted into through-holes in the power board 60 and are soldered on one surface (the upper surface in FIGS. 3A and 3B) of the power board 60. Note that the second motor terminal connectors 61CB may be soldered on the power board 60 by reflow soldering.

Note that the first motor terminal connectors 61CA including a U-phase first motor terminal connector 61UCA, a V-phase first motor terminal connector 61VCA, and a W-phase first motor terminal connector 61WCA are preferably similar to the second motor terminal connectors 61CB, and hence overlapping descriptions thereof are omitted.

The first motor terminal connectors 61CA and the second motor terminal connectors 61CB preferably have the same shape. Further, the first motor terminal connectors 61CA and the second motor terminal connectors 61CB preferably have the same shape as the power supply terminal connector 63CP and the Ground terminal connector 63CG. The entire cost of the motor control device 300 is able to be reduced or minimized by applying the same components to the first motor terminal connectors 61CA, the second motor terminal connectors 61CB, the power supply terminal connector 63CP, and the Ground terminal connector 63CG.

As shown in FIGS. 3A and 3B, the heat sink 50 is cylindrical, and is preferably made of a metal material such as aluminum. For example, the diameter of the heat sink 50 is preferably equal to the diameter of the housing 202 of the motor 200. The mechatronic integration motor is able to be downsized by reducing the diameter of the heat sink 50.

The heat sink 50 preferably includes two flanges 51 and two recessed portions. The two flanges 51 and the two recessed portions are defined on a cylindrical portion of the heat sink 50. One recessed portion is fitted with an O-ring 54H, and the other recessed portion is fitted with an O-ring 54L. The flanges 51 are arranged between the two recessed portions, that is, between the O-ring 54H and the O-ring 54L.

Further, the heat sink 50 preferably includes holes 53P, 53G, 52A, and 52B penetrating through one end portion (an upper end portion in FIGS. 3A and 3B) and the other end portion (a lower end portion in FIGS. 3A and 3B) of the heat sink 50.

The power supply terminal 13TP and the power supply terminal connector 63CP pass through the hole 53P. The Ground terminal 13TG and the Ground terminal connector 63CG pass through the hole 53G. The first signal connector 62A passes through the hole 52A. The second signal connector 62B passes through the hole 52B.

The heat sink 50 includes a plurality of fixing portions (see FIG. 3B), which fix the power board 60, on the lower surface (a lower surface in FIGS. 3A and 3B). The plurality of fixing portions 56 are screw holes, for example.

An upper surface (an upper surface in FIGS. 3A and 3B) of the heat sink 50 preferably has a recessed shape in order to house the control board 30.

The heat sink 50 radiates heat generated by the computing device 31 and the like mounted on the control board 30, and heat generated by the first switching element 68A, the second switching element 68B, and the like mounted on the power board 60.

As shown in FIG. 3A, FIG. 3B, and FIG. 4A, the control board 30 is preferably a circular printed circuit mounting board. The mechatronic integration motor is able to be downsized by causing the diameter of the control board 30 to be smaller than the diameter of the motor 200, in detail, by housing the control board 30 in the recessed part of the upper surface of the heat sink 50.

The control board 30 preferably includes a power supply terminal cut portion 33P and a Ground terminal cut portion 33G.

As shown in FIG. 3B and FIG. 4B, the Ground terminal 13TG and the Ground terminal connector 63CG pass through the Ground terminal cut portion 33G. Similarly, the power supply terminal 13TP and the power supply terminal connector 63CP pass through the power supply terminal cut portion 33P.

The power supply terminal cut portion 33P is larger than the power supply terminal 13TP and the power supply terminal connector 63CP to fit with the power supply terminal 13TP and the power supply terminal connector 63CP. Further, the Ground terminal cut portion 33G is larger than the Ground terminal 13TG and the Ground terminal connector 63CG to fit with the Ground terminal 13TG and the Ground terminal connector 63CG.

Meanwhile, the power supply terminal 13TP is electrically insulated from the control board 30 by the cover portion 63RP of the power supply terminal connector 63CP. Further, the Ground terminal 13TG is electrically insulated from the control board 30 by the cover portion of the Ground terminal connector 63CG.

Therefore, the component mounting area of the control board 30 is able to be increased and the component mounting efficiency is able to be enhanced by causing the power supply terminal cut portion 33P and the Ground terminal cut portion 33G to be as small as possible.

On the control board 30, the computing device 31 (see FIG. 2) is at least mounted. The computing device 31 is preferably a one-chip computer such as an MCU (Micro Control Unit), for example.

The computing device 31 is preferably soldered on the control board 30 by reflow soldering, for example.

As shown in FIGS. 3A and 3B, the resin cover 10 is cylindrical. In detail, the resin cover 10 preferably has a shape in which one end portion (an upper end portion in FIGS. 3A and 3B) of the cylindrical portion is closed and the other end portion (a lower end portion in FIGS. 3A and 3B) is open.

The resin cover 10 preferably includes an external power supply connector 14C, external signal connectors 12C, two flanges 11, a metal reinforcing portion 15, the power supply terminal 13TP and the Ground terminal 13TG made of a metal material, and external signal terminals 12T made of a metal material. The external power supply connector 14C is connected to the power supply terminal 13TP and the Ground terminal 13TG. An electric power supply source 400 (see FIG. 1) is electrically connected to the external power supply connector 14C. The external signal connectors 12C are connected to the external signal terminals 12T. For example, external signals such as a torque signal from a torque sensor 94 (see FIG. 1) and communication signals from other control devices are input to the external signal connectors 12C. The external power supply connector 14C and the external signal connectors 12C are arranged on one end portion of the cylindrical resin cover 10.

The two flanges 11 are preferably arranged on the cylindrical portion of the resin cover 10. The flanges 11 include holes in which a screw, for example, is accommodated. The metal reinforcing portion 15 is made of a metal material. The metal reinforcing portion 15 reinforces the cylindrical portion of the resin cover 10 made of a resin material. The resin cover 10 is preferably defined by integrally molding the external power supply connector 14C including the power supply terminal 13TP and the Ground terminal 13TG, and the external signal connectors 12C including the external signal terminals 12T with a resin material.

As shown in FIGS. 3A and 3B, when the power board 60 and the heat sink 50 are fixed, the first signal connector 62A mounted on the power board 60 passes through the hole 52A in the heat sink 50, the second signal connector 62B passes through the hole 52B, the power supply terminal connector 63CP passes through the hole 53P, and the Ground terminal connector 63CG passes through the hole 53G. The power board 60 is fixed to the heat sink 50 by the four fixing portions 56 of the heat sink 50.

The power supply terminal connector terminal 63TP of the power supply terminal connector 63CP is electrically insulated from the inner circumferential surface of the hole 53P in the heat sink 50 by the cover portion 63RP of the power supply terminal connector 63CP arranged therebetween. Further, the Ground terminal connector terminal 63TG of the Ground terminal connector 63CG is electrically insulated from the inner circumferential surface of the hole 53G in the heat sink 50 by the cover portion of the Ground terminal connector 63CG arranged therebetween.

The first signal connector 62A preferably includes first signal terminals 62LTA made of a metal material, and a cover portion made of a resin material. The first signal terminals 62LTA of the first signal connector 62A are electrically insulated from the heat sink 50 by the cover portion of the first signal connector 62A.

The second signal connector 62B preferably includes the second signal terminals 62LTB made of a metal material, and a cover portion made of a resin material. The second signal terminals 62LTB of the second signal connector 62B are electrically insulated from the heat sink 50 by the cover portion of the second signal connector 62B.

As described above, the first switching element 68A and the second switching element 68B are mounted on the upper surface of the power board 60. Further, the upper surface of the power board 60 is thermally connected to the heat sink 50 via an electrically insulative heat conductive member (not shown). The electrically insulative heat conductive member is preferably thermal grease or a heat radiation sheet, for example.

As shown in FIG. 3A, FIG. 3B, FIG. 4A, and FIG. 4B, upper end portions of the second signal connector positioning portions 62LF1B and 62LF2B are inserted into positioning holes in the control board 30 and are connected to the control board 30 by snap-fit connection. Upper end portions of the second signal terminals 62LTB are inserted into through-holes in the control board 30 and are electrically connected to the control board 30 by press-fit connection. The power board 60 and the control board 30 are electrically connected to each other by the second signal terminals 62LTB.

Note that the upper end portions of the second signal terminals 62LTB may be inserted into the through-holes in the control board 30 and soldered on an upper surface (an upper surface in FIG. 4B) of the control board 30.

Note that the first signal connector 62A is similar to the second signal connector 62B, and hence overlapping descriptions thereof are omitted.

As shown in FIG. 3B, lower end portions of the external signal terminals 12T of the resin cover 10 are preferably inserted into through-holes in the control board 30 and are electrically connected to the control board 30 by snap-fit connection, for example.

The power supply terminal 13TP of the resin cover 10 passes through the power supply terminal cut portion 33P in the control board 30 and is preferably electrically connected to the power supply terminal connector 63CP by press-fit connection, for example.

The Ground terminal 13TG of the resin cover 10 passes through the Ground terminal cut portion 33G of the control board 30 and is preferably electrically connected to the Ground terminal connector 63CG by press-fit connection, for example.

As shown in FIGS. 3A and 3B, the motor control device 300 is preferably defined by connecting the resin cover 10, the control board 30, the heat sink 50, and the power board 60 to each other. The first motor terminal connectors 61CA and the second motor terminal connectors 61CB are arranged in a lower portion (a lower portion in FIGS. 3A and 3B) of the motor control device 300.

The second motor terminal connectors 61CB are electrically connected to a second motor terminal 261TB including a U-phase second motor terminal 261UTB, a V-phase second motor terminal 261VTB, and a W-phase second motor terminal 261WTB by press-fit connection. The second motor terminal 261TB is connected to the coils 21B of the motor 200. That is, the motor control device 300 is electrically connected to the motor 200.

Note that the first motor terminal connectors 61CA are similar to the second motor terminal connectors 61CB, and hence overlapping descriptions thereof are omitted.

When the motor control device 300 and the motor 200 are connected to each other, the two flanges 11 of the resin cover 10, the two flanges 51 of the heat sink 50, and the two flanges 201 of the motor 200 are preferably fastened together by two fixing members (not shown). The fixing members are screws, for example.

As shown in FIGS. 3A and 3B, a gap between the heat sink 50 of the motor control device 300 and the motor 200 is preferably sealed by the O-ring 54L of the heat sink 50.

A gap between the resin cover 10 and the heat sink 50 is sealed by the O-ring 54H of the heat sink 50. The deformation of the cylindrical portion of the resin cover 10 is reduced or prevented by reinforcing the cylindrical portion of the resin cover 10 by the metal reinforcing portion 15, and the sealing property can be enhanced.

In the waterproof structure of the mechatronic integration motor as above, the gap between the resin cover 10 and the heat sink 50 and the gap between the heat sink 50 and the motor 200 are sealed.

As shown in FIGS. 3A and 3B, the resin cover 10, the control board 30, the power board 60, and the heat sink 50 are disposed in the order of the power board 60, the heat sink 50, the control board 30, and the resin cover 10 in the axial direction (the vertical direction in FIGS. 3A and 3B) of the motor 200 from the motor 200 side (the lower side in FIGS. 3A and 3B). Further, as shown in FIG. 3B, the plurality of electrolytic capacitors 44D are preferably mounted on the surface of the power board 60 on the motor 200 side (the lower side in FIG. 3B). Further, the power board 60 is covered by the housing 202 of the motor 200. Therefore, according to the motor control device 300 of this preferred embodiment, the component mounting efficiency of the control board 30 is able to be enhanced by eliminating the need to form a cut in the control board 30 in order to avoid interference with the second motor terminal 261TB connected to the coils of the motor 200. Further, the heat sink 50 is able to be used for both the control board 30 and the power board 60. Further, the electrolytic capacitors 44D each having a large height dimension are able to be arranged in a dead space in the housing 202 of the motor 200. As a result, the entire assembly of the motor control device 300 and the motor 200 is able to be downsized.

As described above, the power supply terminal 13TP of the resin cover 10 and the power supply terminal connector 63CP of the power board 60 are preferably connected to each other by press-fit connection, for example. Further, as shown in FIGS. 3A and 3B, the hole 53P is defined in the heat sink 50, and the power supply terminal cut portion 33P is defined in the control board 30. Therefore, according to the motor control device 300 of this preferred embodiment, the assembling properties of the resin cover 10, the control board 30, the heat sink 50, the power board 60, and the motor 200 are able to be enhanced.

As described above, the power supply terminal connector terminal 63TP of the power supply terminal connector 63CP and the inner circumferential surface of the hole 53P in the heat sink 50 are insulated by the cover portion 63RP of the power supply terminal connector 63CP arranged therebetween. Therefore, according to the motor control device 300 of this preferred embodiment, a short circuit between the power supply terminal connector terminal 63TP and the heat sink 50 is able to be reduced or prevented by the cover portion 63RP.

As described above, the plurality of second signal terminals 62LTB are disposed on the outer peripheral portion of the power board 60 in an arc-shaped manner. Similarly, the plurality of first signal terminals 62LTA are disposed on the outer peripheral portion of the power board 60 in an arc-shaped manner. Therefore, according to the motor control device 300 of this preferred embodiment, other components are able to be efficiently mounted on a portion of the power board 60 on the inner side of the first signal terminals 62LTA and the second signal terminals 62LTB, and the component mounting efficiency of the power board 60 is able to be enhanced. Specifically, the first signal terminals 62LTA and the second signal terminals 62LTB are arranged on the disk-shaped power board 60 in an arc-shaped manner, and hence the area of the board on the inner side of the first signal terminals 62LTA and the second signal terminals 62LTB is able to be effectively used and other components are able to be efficiently mounted.

The preferred embodiments of this disclosure may be widely used in an electric power steering apparatus, for example.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A motor control device that controls a motor, the motor control device comprising:
   a resin cover defined by integrally molding an external power supply connector to be connected to an electric power supply source, and a plurality of external signal connectors with a resin material;
   a control board on which at least a computing device is mounted;
   a power board on which at least an inverter circuit and a plurality of electrolytic capacitors are mounted; and
   a heat sink that radiates heat generated by the control board and heat generated by the power board; wherein
   the motor control device is electrically connected to the motor;
   the resin cover, the control board, the power board, and the heat sink are disposed in order of the power board, the heat sink, the control board, and the resin cover in an axial direction of the motor from a motor side of the motor control device;
   the plurality of electrolytic capacitors are mounted on a surface of the power board on a motor side of the power board; and
   the power board is covered by a housing of the motor.

2. The motor control device according to claim 1, wherein
   the resin cover includes a power supply terminal connected to the external power supply connector;
   the power board includes a power supply terminal connector to be electrically connected to the power supply terminal with a press-fit connection;
   the power supply terminal connector is mounted on a surface of the power board that is on an opposite side from the motor;
   the heat sink includes a hole through which the power supply terminal and the power supply terminal connector pass;

the control board includes a cut portion that is larger than the power supply terminal and the power supply terminal connector; and the resin cover, the control board, the heat sink, the power board, and the motor are fixed by a plurality of fixing members in a state in which the power supply terminal and the power supply terminal connector pass through the hole and fit with the cut portion.

3. The motor control device according to claim 2, wherein the power supply terminal connector includes a power supply terminal connector terminal made of a metal material, and a cover portion made of an electrical insulating material;

the power supply terminal is connected to the power supply terminal connector terminal with a press-fit connection; and the cover portion is located between the power supply terminal connector terminal and an inner circumferential surface of the hole.

4. The motor control device according to claim 3, wherein the cover portion is made of a resin material.

5. The motor control device according to claim 3, wherein the power supply terminal connector terminal is connected to the power board by solder; and an internal space is located between a portion of the power supply terminal connector terminal that is connected to the power board, and the cover portion.

6. The motor control device according to claim 4, wherein the power supply terminal connector terminal is connected to the power board by solder; and an internal space is located between a portion of the power supply terminal connector terminal that is connected to the power board, and the cover portion.

7. The motor control device according to claim 2, wherein the power board includes a motor terminal connector to be electrically connected, with a press-fit connection, to a motor terminal connected to a coil of the motor;

the motor terminal connector is mounted on a surface of the power board that is on the motor side; and the motor terminal connector has a same shape as the power supply terminal connector.

8. The motor control device according to claim 3, wherein the power board includes a motor terminal connector to be electrically connected, with a press-fit connection, to a motor terminal connected to a coil of the motor;

the motor terminal connector is mounted on a surface of the power board that is on the motor side; and the motor terminal connector has a same shape as the power supply terminal connector.

9. The motor control device according to claim 4, wherein the power board includes a motor terminal connector to be electrically connected, with a press-fit connection, to a motor terminal connected to a coil of the motor;

the motor terminal connector is mounted on a surface of the power board that is on the motor side; and the motor terminal connector has a same shape as the power supply terminal connector.

10. The motor control device according to claim 5, wherein the power board includes a motor terminal connector to be electrically connected, with a press-fit connection, to a motor terminal connected to a coil of the motor;

the motor terminal connector is mounted on a surface of the power board that is on the motor side; and the motor terminal connector has a same shape as the power supply terminal connector.

11. The motor control device according to claim 1, further comprising a plurality of signal terminals that electrically connect the control board and the power board to each other, wherein the power board is circular; and the plurality of signal terminals are disposed on an outer peripheral portion of the power board in an arc-shaped manner.

12. The motor control device according to claim 2, further comprising a plurality of signal terminals that electrically connect the control board and the power board to each other, wherein the power board is circular; and the plurality of signal terminals are disposed on an outer peripheral portion of the power board in an arc-shaped manner.

13. The motor control device according to claim 3, further comprising a plurality of signal terminals that electrically connect the control board and the power board to each other, wherein the power board is circular; and the plurality of signal terminals are disposed on an outer peripheral portion of the power board in an arc-shaped manner.

14. An electric power steering apparatus, comprising the motor control device according to claim 1.

15. An electric power steering apparatus, comprising the motor control device according to claim 2.

16. An electric power steering apparatus, comprising the motor control device according to claim 3.

17. An electric power steering apparatus, comprising the motor control device according to claim 4.

18. An electric power steering apparatus, comprising the motor control device according to claim 5.

19. An electric power steering apparatus, comprising the motor control device according to claim 7.

20. An electric power steering apparatus, comprising the motor control device according to claim 11.

* * * * *